United States Patent
Rho et al.

[11] Patent Number: 5,811,132
[45] Date of Patent: Sep. 22, 1998

[54] MOLD FOR SEMICONDUCTOR PACKAGES

[75] Inventors: Hee Sun Rho; Hee Kook Choi; In Sik Cho; Tae Sung Park, all of Chungcheongnam-do, Rep. of Korea

[73] Assignee: Samsung Electronics Co., Ltd., Suwon, Rep. of Korea

[21] Appl. No.: 542,011

[22] Filed: Oct. 12, 1995

[30] Foreign Application Priority Data

Jul. 25, 1995 [KR] Rep. of Korea .................. 1995-22122

[51] Int. Cl.[6] .................................................. B29C 45/14
[52] U.S. Cl. ............... 425/116; 264/272.11; 264/272.17; 425/129.1; 425/544; 425/568
[58] Field of Search ..................... 425/116, 117, 425/127, 129.1, 544, 568; 264/272.17, 272.11

[56] References Cited

U.S. PATENT DOCUMENTS

| | | | |
|---|---|---|---|
| 4,954,308 | 9/1990 | Yabe et al. | 264/272.17 |
| 5,326,243 | 7/1994 | Fierkens | 425/116 |
| 5,356,283 | 10/1994 | Hamada et al. | 264/272.17 |
| 5,401,155 | 3/1995 | Shikagawa et al. | 425/127 |
| 5,635,220 | 6/1997 | Izumi et al. | 425/116 |

*Primary Examiner*—Patrick Ryan
*Assistant Examiner*—Joseph Leyson
*Attorney, Agent, or Firm*—Jones & Volentine, L.L.P.

[57] ABSTRACT

An improved mold for forming a semiconductor package, having a molding compound injection gate having a height not greater than the thickness of the lead frame of the semiconductor assembly placed in the mold.

6 Claims, 7 Drawing Sheets

MOLD FOR SEMICONDUCTOR PACKAGES

BACKGROUND OF THE INVENTION

The present invention relates generally to molding equipment for use in assembling semiconductor packages, and to a molding method using such equipment. More particularly, the present invention relates to an improved mold for semiconductor packages having an injection gate with a height not larger than the thickness of a lead frame of the semiconductor assembly placed in the mold. Use of the molding equipment according to the present invention, results in significantly fewer semiconductor packages being damaged during the molding process.

Generally speaking, semiconductor devices such as diodes, transistors, and integrated circuits are manufactured into a "chip" by forming circuit patterns and discrete elements on a silicon wafer. A plurality of such chips are formed on a single wafer. Individual chips are routinely removed from the wafer by means of a sawing process. The chip is then encapsulated in, for example, epoxy resin to protect it from environmental factors such as dust, heat, moisture, static electricity, and mechanical shocks. The specific encapsulation process used is dictated by the metals, ceramics and/or molding compounds used in the chip.

Molding equipment is a well known component used in the process of forming semiconductor packages. Recently, as the demand for miniaturization of semiconductor packages has increased, the molding process, the mold design itself, and the equipment operating on the mold have become increasingly important. Even when the molding equipment is operating without defect, package failures may occur because of package cracks, or "chip-out" during the molding process. In addition to the obvious reliability issues, mold design is also critical to equipment yield.

Typically, a mold die (or set) for use in molding equipment applied to semiconductor packaging has two halves; a top half and a bottom half. These opposing halves open to receive chip-wire-lead frame assemblies, and close during the molding cycle.

Conventional molding equipment includes gates and runners which transfer the molding compound to mold cavities formed between mated mold set halves. Gates are small openings into these cavities through which the molding compound is injected. Gates are usually placed in either the bottom or top mold half (or die).

An example of conventional molding equipment having gates in the bottom mold half, variously referred to as "bottom gate type" or "bottom gate" molding equipment, is shown in FIG. 1A. FIG. 1B is a cross-sectional side view of the molding equipment shown in FIG. 1A and better illustrates the gate. FIG. 1C is a schematic diagram showing the molding mechanism in the conventional molding equipment of FIG. 1A.

With reference to FIGS. 1A, 1B, and 1C, bottom gate molding equipment (100) comprises a top mold die (80), a bottom mold die (90), cavities (82, 92), where a chip-wire-lead frame assembly (50) is placed between the top and bottom mold dies for molding. Runner and gate (94) for transferring molding compound (not shown) are placed in the bottom mold die (90). The chip-wire-lead frame assembly (50), which is a partially assembled semiconductor package, has a structure including chip (20) bonded to a die pad (10) by an adhesive (not shown), and electrically connected to inner leads (30, 40) by bonding wires.

Gate (94) is formed in the bottom mold (90) with a height greater than the thickness of inner leads (30, 40). Molding compound (not shown), which is transferred through the gate (94), flows into cavities (82, 92) in the directions indicated by arrows as shown in FIG. 1C.

FIGS. 2A–2C and FIGS. 3A–3C respectively show conventional "top gate" molding equipment having gates in the top mold die, and conventional "center gate" molding equipment having gates placed in the mating surfaces of the bottom and top mold dies. With the notable exception of the gate location and the flow direction of the molding compound (shown by the flow arrows in each case), the top and center gate molding equipment have the same structure as that of the bottom gate molding equipment already described with reference to FIGS. 1A–1C. Therefore, a detailed explanation of the top and center gate molding equipments will be omitted.

As noted, conventional molding equipment has a gate located in a variety of positions, but nevertheless having a height greater than the thickness of the inner leads on the lead frame. When the molded semiconductor package is removed from the mold, the molding compound that is set or hardened in the gate is broken away from the molding compound encasing the package. During this extraction process, package failure such as package breaks, cracks, or chip-out may occur. Such failures become more significant during the formation of slim packages such as Thin Small Outline Package (TOP) or Ultra Thin Small Outline package (UTSOP). Further, when removed from the foregoing molding equipment, the resulting semiconductor package has overly thick molding compound structures in the portion of the package from around the gate area. Such an appearance is undesirable.

SUMMARY OF THE INVENTION

The present invention provides molding equipment with a reduced gate profile for molded semiconductor packages with improved reliability.

In one aspect, the present invention provides improved molding equipment for semiconductor packaging comprising; a top mold die and a bottom mold die forming together a cavity adapted to receive a semiconductor chip assembly comprising a lead frame of first thickness, the bottom mold die having at least one gate formed therein for injecting a molding compound into the cavity, the gate having a height not greater than the first thickness.

In another aspect, the present invention provides improved molding equipment for semiconductor packaging comprising; a top mold die and a bottom mold die forming together a cavity adapted to receive a semiconductor chip assembly comprising a lead frame of first thickness, the top mold die having at least one gate formed therein for injecting a molding compound into the cavity, the gate having a height not greater than the first thickness.

In yet another aspect, the present invention provides improved molding equipment for semiconductor packaging comprising; a top mold die and a bottom mold die forming together a cavity adapted to receive a semiconductor chip assembly comprising a lead frame of first thickness, the top and bottom mold dies having at least one center gate formed therein for injecting a molding compound into the cavity, the gate having a height not greater than the first thickness.

The present invention is also characterized by a method of molding a semiconductor package comprising the steps of; loading a semiconductor assembly comprising a lead frame having first thickness into a mold cavity formed by top and bottom mold dies, transferring a molding compound into the mold cavity via at least one gate to carry out compression molding, and ejecting a molded semiconductor assembly, wherein the at least one gate has a height not larger than the first thickness, but preferably greater than 50% of the first thickness.

BRIEF DESCRIPTION OF THE DRAWINGS

These features and other advantages of the present invention will be readily understood upon consideration of the following detailed description taken in conjunction with the accompanying drawings, wherein like reference numerals designate like structural elements, and, in which.

DETAILED DESCRIPTION OF THE INVENTION

Figure 1A:
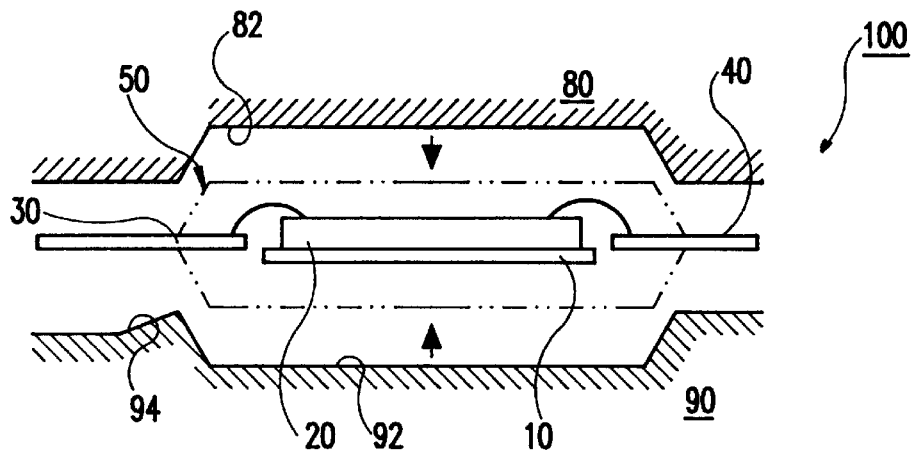
FIG. 1A is a cross-sectional view of conventional molding equipment having gates in the bottom mold die.
Figure 1B:
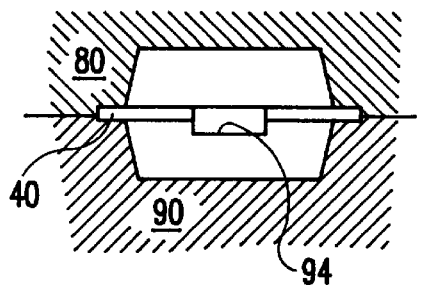
FIG. 1B is a side cross-sectional view of molding equipment of FIG. 1A, showing the gates.
Figure 1C:
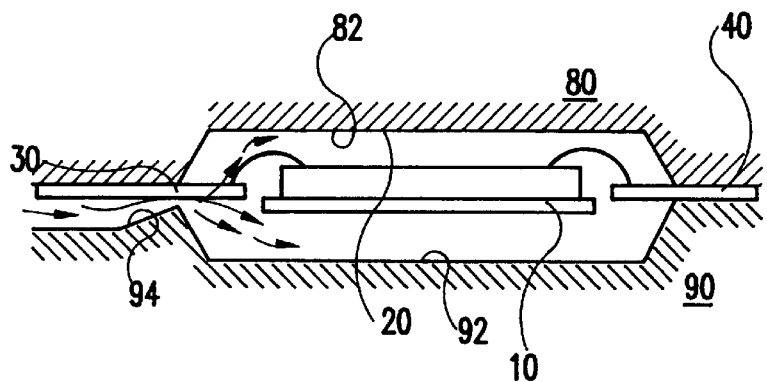
FIG. 1C is a schematic diagram showing molding mechanism of the conventional molding equipment of FIG. 1A.
Figure 2A:
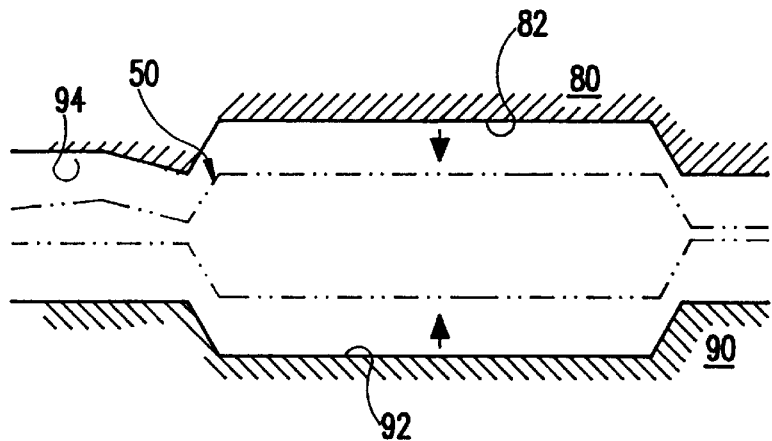
FIG. 2A is a cross-sectional view of conventional molding equipment having gates in the top mold die.
Figure 2B:
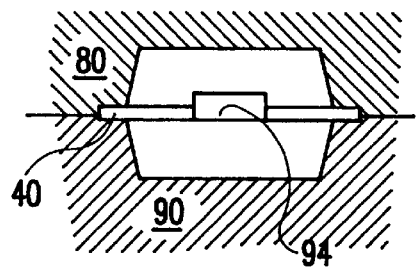
FIG. 2B is a side cross-sectional view of molding equipment of FIG. 2A, showing the gates.
Figure 2C:
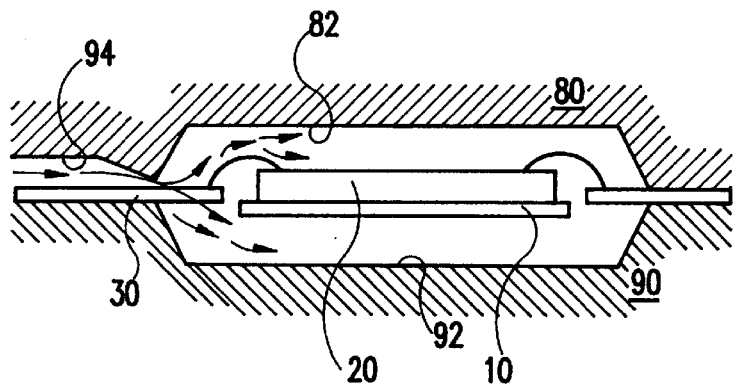
FIG. 2C is a schematic diagram showing molding mechanism of the conventional molding equipment of FIG. 2A.
Figure 3A:
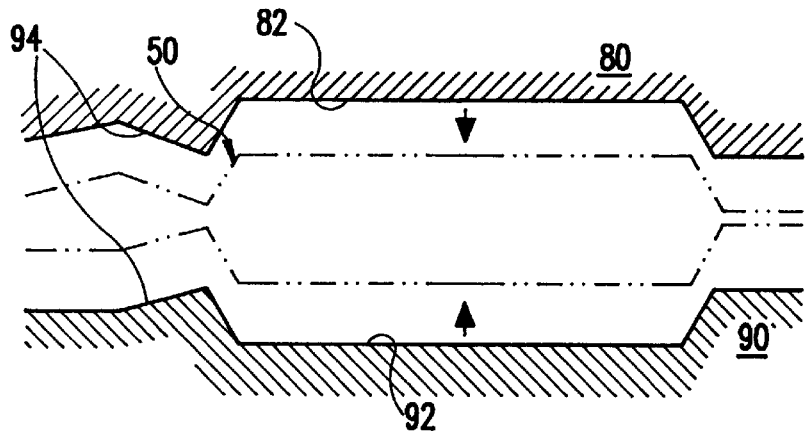
FIG. 3A is a cross-sectional view of conventional molding equipment having gates in the mating surface of top and bottom mold dies.
Figure 3B:
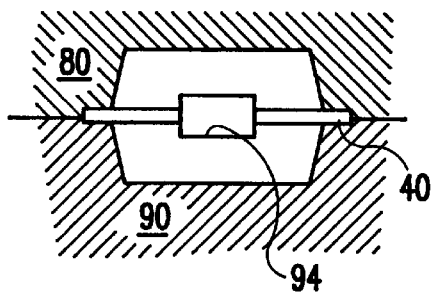
FIG. 3B is a side cross-sectional view of molding equipment of FIG. 3A, showing the gates.
Figure 3C:
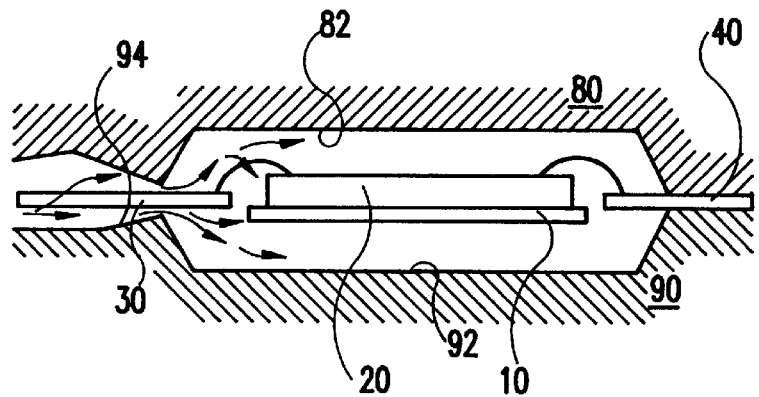
FIG. 3C is a schematic diagram showing molding mechanism of the conventional molding equipment of FIG. 3A.
Figure 4A:
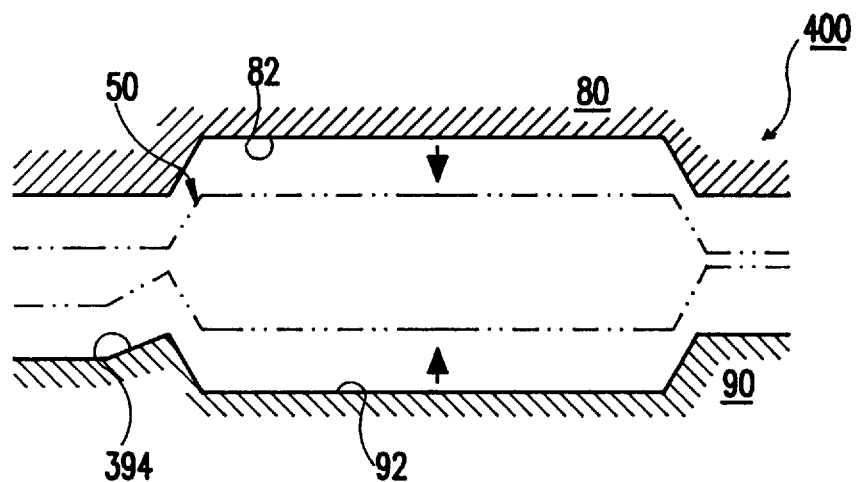
FIG. 4A is a cross-sectional view of one embodiment of molding equipment having gates in the bottom mold die according to the present invention.
Figure 4B:
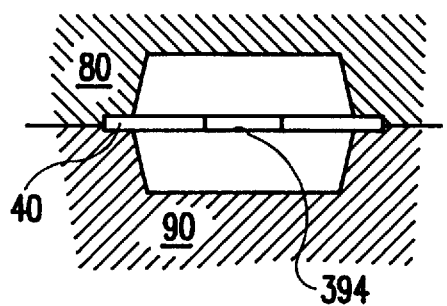
FIG. 4B is a side cross-sectional view of molding equipment of FIG. 4A, showing the gates.
Figure 4C:
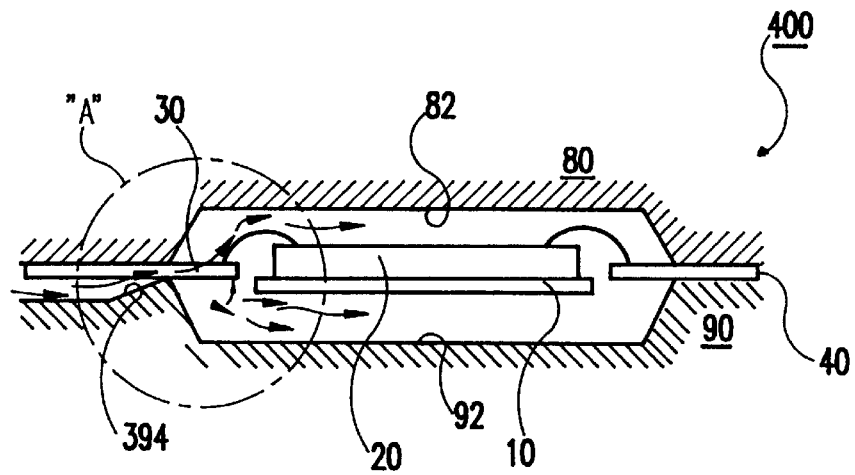
FIG. 4C is a schematic diagram showing molding mechanism of the molding equipment of FIG. 4A.
Figure 4D:
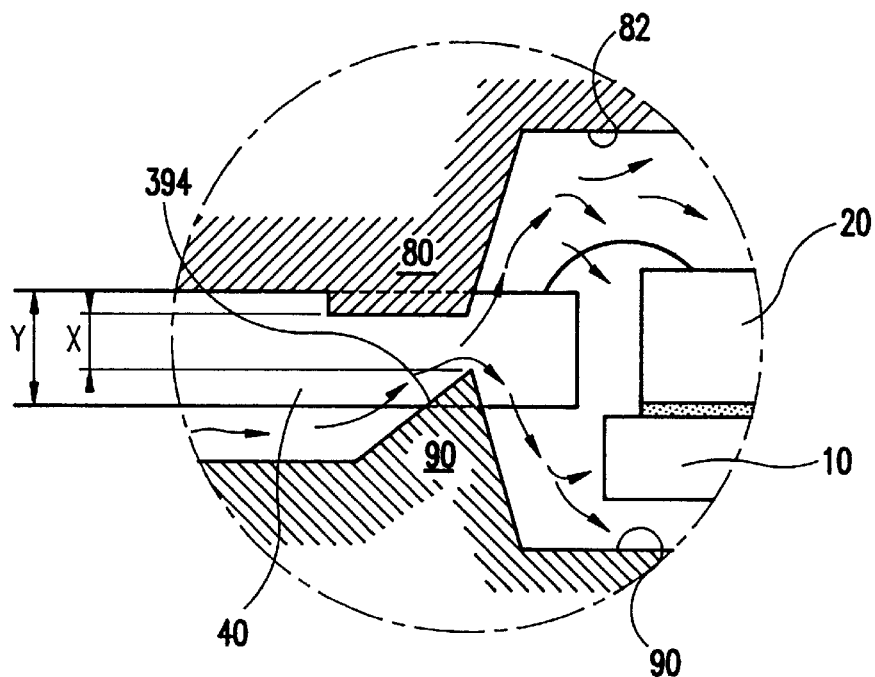
FIG. 4D is an enlarged view of the part "A" in FIG. 4C.
Figure 5A:
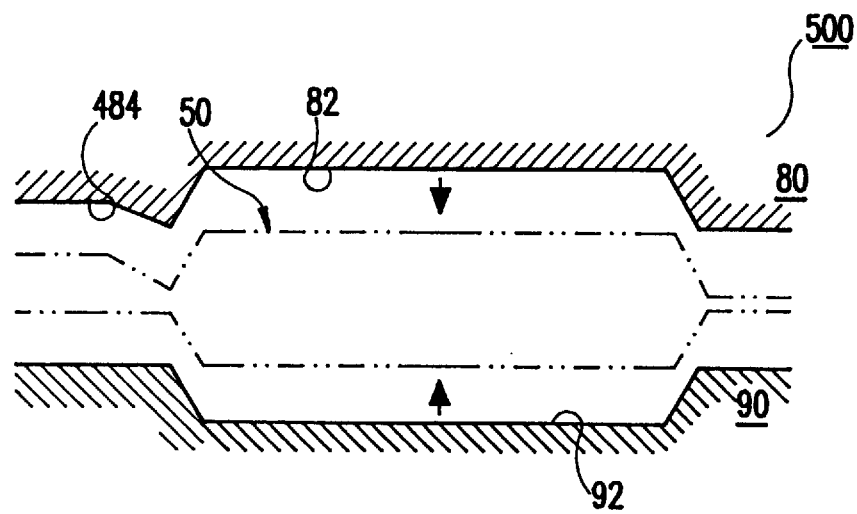
FIG. 5A is a cross-sectional view of another embodiment of molding equipment having gates in the top mold die according to the present invention.
Figure 5B:
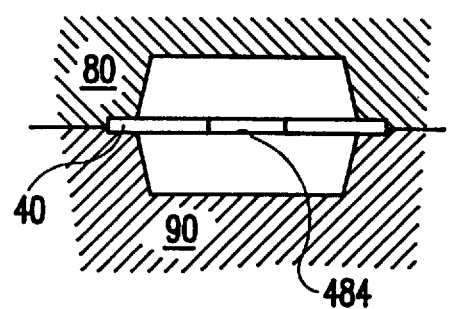
FIG. 5B is a side cross-sectional view of molding equipment of FIG. 5A, showing the gates.
Figure 5C:
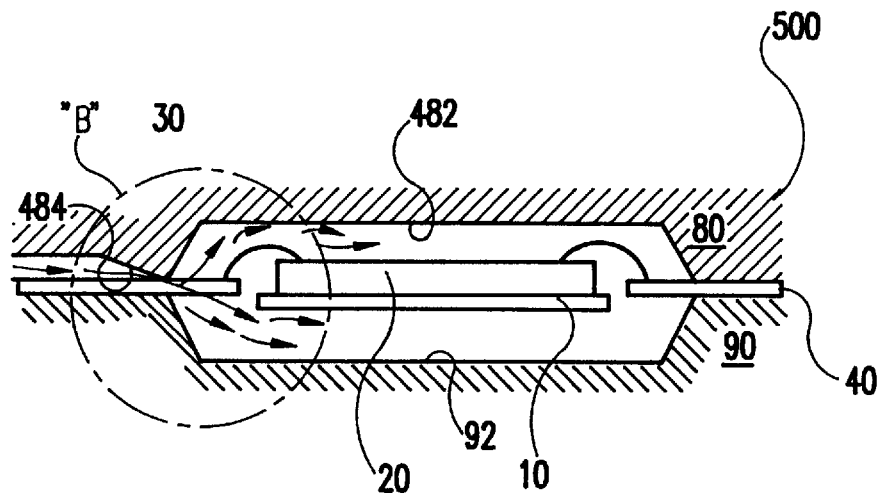
FIG. 5C is a schematic diagram showing molding mechanism of the molding equipment of FIG. 5A.
Figure 5D:
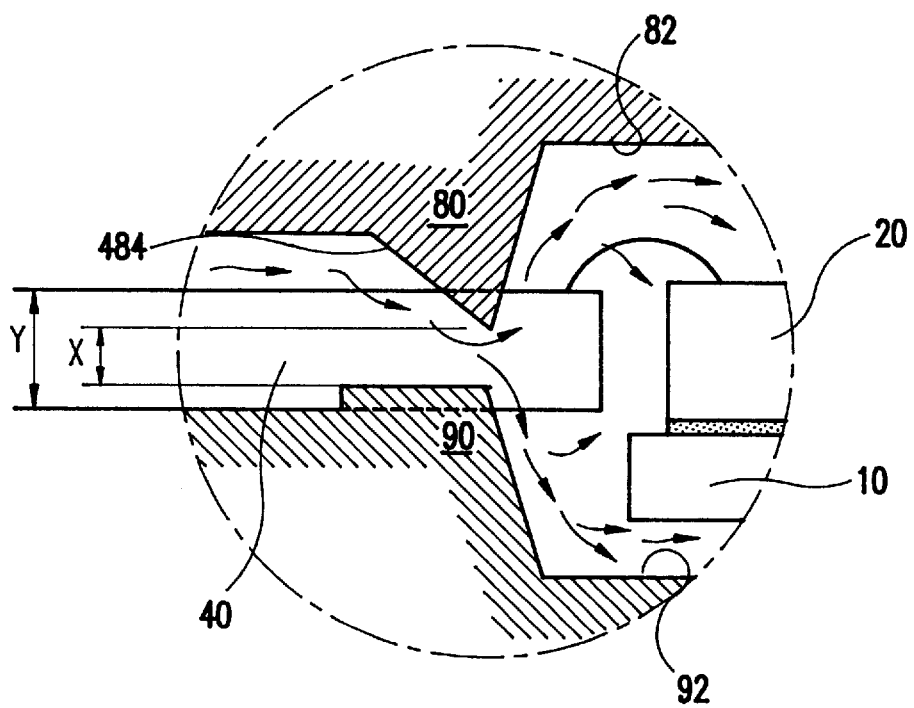
FIG. 5D is an enlarged view of the part "B" in FIG. 5C.

With now reference to FIGS. 4A–4D, molding equipment (400) having at least one gate (394) in the bottom mold die has, otherwise, the same structure as the conventional bottom gate molding equipment shown in FIGS 1A–1C. The difference between conventional gate (94) and improved gate (394) is the height (X) of improved gate (394) is at least equal to, and preferably less than the thickness (Y) of the inner leads (30, 40). The molding compound is transferred into the cavities (82, 92) in the directions indicated by arrows as shown in FIGS. 4C and 4D.

FIGS. 5A–5D show an another embodiment of molding equipment according to the present invention. However, FIGS. 5A–5D show improved top gate molding equipment. Top gate molding equipment (500) has the same structure as that of the bottom gate molding equipment (400) as described above in regard with FIGS. 4A–4D, except for position and shape of gate (484), and the resulting flow direction of injected molding compound.

The molding process according to the present invention comprises the steps of (a) loading a chip-wire-lead frame assembly into a cavity of a mold die; (b) transferring molding compound via at least one gate into the cavity to carry out compression molding; and, (c) ejecting a molded assembly, the method is characterized in that the gate through which the molding compound is injected has a height equal to or less than the thickness of the inner leads on the lead frame. The specific conditions of the molding process is not critical to the present invention, and may be selected from a range of conditions known to those of ordinary skilled in the art. To evaluate the effect of the improved molding equipment and method for using same on the reduction of package failures, multiple 4M DRAM 20TSOP II chips connected to lead frames having a thickness of 6 mil were encapsulated using the improved bottom gate molding equipment shown in FIGS. 4A–4D, and the conventional bottom gate molding equipment. The gate heights for the improved and conventional molding equipment were 5 mil and 10 mil, respectively.

After degating and deflashing, occurrences of chip-out void in the molded packages were calculated. The results and experiment conditions are shown in Table 1.

TABLE 1

| | Conventional | | Improved | |
|---|---|---|---|---|
| | Occurrence/ Total | DPM* | Occupance/ Total | DPM* |
| Chip-out | 6/320 | 18750 | 0/320 | 0 |
| Void | 5/480 | 10416 | 1/480 | 2083 |
| Evaluation Conditions | Press: UPS120N-EX Curing time: 50 sec Clamp pressure: 110 ton Transfer pressure: 2.0 ton Transfer speed: 11.2 sec | | | |

*DPM = Defect Per Million

As can be seen from Table 1, package failures for semiconductor packages encapsulated using the improved molding equipment according to the present invention are significantly reduced as compared with those encapsulated by using the conventional molding equipment. Further, it can be visually observed that the degated package resulting from the improved method has a smoother surface. Accordingly, the improved molding equipment having at least one gate with a height not more than the thickness of inner leads on the lead frame is advantageous over the conventional equipment and results in semiconductor packages having greater reliability and better outward appearance.

Although only the results of testing using the improved bottom gate molding equipment was described above, the attendant advantages are equally applicable to the improved top molding equipment shown in FIGS. 5A–5D and to similarly improved center gate molding equipment (not illustrated by specific figures, but readily understood by the foregoing discussion). Molding equipment according to the present invention may be employed for encapsulation of semiconductor chips with lead frames having a thickness in the range of from 6 to 12 mil, and preferably from 6 to 10 mil. As stated above, the height of gate is not larger than thickness of lead frame, but is preferably greater than 50% the thickness of lead frame.

The exemplary embodiments of the present invention have been given by way of example. Variations and/or modifications to the basic inventive concept are considered to be within the range of ordinary skill in the art, and will fall within the spirit and scope of the present invention as defined in the appended claims.

What is claimed is:

1. A mold for forming a semiconductor package, comprising:

a top mold die and a bottom mold die forming together a cavity adapted to receive a semiconductor chip assembly comprising a lead frame of first thickness, the bottom mold die having at least one gate formed therein for injecting a molding compound into the cavity and providing a separation junction for separating said semiconductor package from molding compound remaining in the gate, the gate having a height not greater than the first thickness.

2. The mold of claim 1, wherein the height of the gate is greater than 50% of the first thickness.

3. A mold for forming a semiconductor package, comprising:

a top mold die and a bottom mold die forming together a cavity adapted to receive a semiconductor chip assembly comprising a lead frame of first thickness, the top mold die having at least one gate formed therein for injecting a molding compound into the cavity and providing a separation junction for separating said semiconductor package from molding compound remaining in the gate, the gate having a height not greater than the first thickness.

4. The mold of claim 3, wherein the height of the gate is greater than 50% of the first thickness.

5. A mold for forming a semiconductor package, comprising:

a top mold die and a bottom mold die forming together a cavity adapted to receive a semiconductor chip assembly comprising a lead frame of first thickness, the top and bottom mold dies having at least one center gate formed therein for injecting a molding compound into the cavity and providing a separation junction for separating said semiconductor package from molding compound remaining in the gate, the gate having a height not greater than the first thickness.

6. The mold of claim 5, wherein the height of the gate is greater than 50% of the first thickness.

* * * * *